US010361210B2

(12) United States Patent
Basker et al.

(10) Patent No.: US 10,361,210 B2
(45) Date of Patent: Jul. 23, 2019

(54) LOW-DRIVE CURRENT FINFET STRUCTURE FOR IMPROVING CIRCUIT DENSITY OF RATIOED LOGIC IN SRAM DEVICES

(71) Applicant: International Business Machines Corporation, Armonk, NY (US)

(72) Inventors: Veeraraghavan S. Basker, Schenectady, NY (US); Dechao Guo, Niskayuna, NY (US); Zuoguang Liu, Schenectady, NY (US); Tenko Yamashita, Schenectady, NY (US); Chun-Chen Yeh, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/953,498

(22) Filed: Nov. 30, 2015

(65) Prior Publication Data
US 2016/0181256 A1    Jun. 23, 2016

Related U.S. Application Data

(62) Division of application No. 14/581,067, filed on Dec. 23, 2014, now Pat. No. 9,859,286.

(51) Int. Cl.
*H01L 27/11* (2006.01)
*H01L 27/088* (2006.01)
(Continued)

(52) U.S. Cl.
CPC .. *H01L 27/1104* (2013.01); *H01L 21/823418* (2013.01); *H01L 21/823431* (2013.01); *H01L 27/0886* (2013.01); *H01L 29/41791* (2013.01)

(58) Field of Classification Search
CPC ............ H01L 27/1104; H01L 27/0886; H01L 29/41791; H01L 21/823418; H01L 21/823431; H01L 21/0886
See application file for complete search history.

(56) References Cited

U.S. PATENT DOCUMENTS 5,706,226 A  *  1/1998  Chan ................... H01L 27/1104
                                                             257/274
6,531,747 B1 *  3/2003  Ashida ................ H01L 27/1104
                                                             257/368
(Continued)

OTHER PUBLICATIONS

Woodard et al, "Low Temperature Dopant Activation for Integrated Electronics Applications", IEEE, pp. 162-168. (Year: 2006).*
(Continued)

*Primary Examiner* — Allen L Parker
*Assistant Examiner* — Charles N Ausar-El
(74) *Attorney, Agent, or Firm* — Cantor Colburn LLP; Vazken Alexanian (57) ABSTRACT

A method of fabricating an SRAM semiconductor device includes forming first and second FinFETs on an upper surface of a bulk substrate. The first FinFET includes a first source/drain region containing first dopants, and the second FinFET includes a second source/drain region containing second dopants. The method further includes selectively controlling a temperature of the second FinFET with respect to a temperature of the first FinFET during an anneal process to activate the first and second dopants such that the second source/drain region is formed having a different electrical resistance with respect to the first source/drain region.

13 Claims, 8 Drawing Sheets

(51) Int. Cl.
*H01L 29/417* (2006.01)
*H01L 21/8234* (2006.01)

(56) References Cited

U.S. PATENT DOCUMENTS

| | | | | |
|---|---|---|---|---|
| 6,876,040 | B1* | 4/2005 | Wann | H01L 21/84 257/351 |
| 7,404,154 | B1* | 7/2008 | Venkatraman | H01L 27/0207 326/103 |
| 8,310,013 | B2* | 11/2012 | Lin | H01L 29/045 257/401 |
| 8,999,792 | B2* | 4/2015 | Li | H01L 21/823431 257/349 |
| 9,287,382 | B1* | 3/2016 | Lee | H01L 21/845 |
| 9,373,550 | B2* | 6/2016 | Basker | H01L 21/823418 |
| 9,401,366 | B1* | 7/2016 | Lu | H01L 21/845 |
| 9,508,729 | B2* | 11/2016 | Liaw | H01L 27/1116 |
| 9,985,032 | B2* | 5/2018 | Basker | H01L 21/823418 |
| 10,217,751 | B2* | 2/2019 | Nii | H01L 27/11 |
| 2001/0052624 | A1* | 12/2001 | Houston | G11C 11/412 257/390 |
| 2002/0195667 | A1* | 12/2002 | Maki | H01L 27/1104 257/379 |
| 2004/0099885 | A1* | 5/2004 | Yeo | H01L 27/11 257/208 |
| 2005/0266643 | A1* | 12/2005 | Burnett | H01L 27/1104 438/275 |
| 2005/0285202 | A1* | 12/2005 | Huang | H01L 27/11 257/368 |
| 2006/0148151 | A1* | 7/2006 | Murthy | H01L 21/02381 438/197 |
| 2007/0063278 | A1* | 3/2007 | Doris | H01L 27/1104 257/347 |
| 2007/0183185 | A1* | 8/2007 | Guo | G11C 11/412 365/156 |
| 2007/0189060 | A1* | 8/2007 | Inaba | G11C 11/412 365/154 |
| 2007/0290192 | A1* | 12/2007 | Rotondaro | H01L 21/823412 257/19 |
| 2009/0014798 | A1* | 1/2009 | Zhu | H01L 21/84 257/351 |
| 2009/0108372 | A1* | 4/2009 | Chen | H01L 27/1104 257/392 |
| 2009/0218631 | A1* | 9/2009 | Zhu | G11C 11/412 257/369 |
| 2011/0026289 | A1* | 2/2011 | Liaw | G11C 11/412 365/51 |
| 2011/0074498 | A1* | 3/2011 | Thompson | H01L 21/823412 327/543 |
| 2011/0103137 | A1* | 5/2011 | Beat | G11C 11/412 365/156 |
| 2011/0133285 | A1* | 6/2011 | Liaw | H01L 27/0207 257/368 |
| 2011/0309448 | A1* | 12/2011 | Chang | H01L 27/0207 257/369 |
| 2011/0317477 | A1* | 12/2011 | Liaw | G11C 8/16 365/156 |
| 2011/0317485 | A1* | 12/2011 | Liaw | H01L 27/11 365/182 |
| 2012/0001197 | A1* | 1/2012 | Liaw | H01L 27/11 257/77 |
| 2013/0235652 | A1* | 9/2013 | Liaw | H01L 27/0207 365/156 |
| 2013/0260525 | A1* | 10/2013 | Chang | H01L 29/7833 438/294 |
| 2014/0084374 | A1* | 3/2014 | Huang | G06F 17/5068 257/368 |
| 2015/0091097 | A1* | 4/2015 | Wu | H01L 27/1104 257/392 |
| 2015/0132903 | A1* | 5/2015 | Liaw | H01L 27/1104 438/212 |
| 2016/0027499 | A1* | 1/2016 | Liaw | G11C 11/412 365/154 |
| 2016/0351249 | A1* | 12/2016 | Liaw | G11C 11/412 |

OTHER PUBLICATIONS

Woodard, "Low Temperature Dopant Activation", 23rd Annual Microelectronic Engineering Conference, May 2005, pp. 52-57 (Year: 2005).*

Woodard, "Low temperature dopant activation for applications in thin film silicon devices" (2006). Thesis, Rochester Institute of Technology. Accessed from RIT Scholar Works ("Woodard"). (Year: 2006).*

Basker et al., "Low-Drive Current Finfet Structure for Improving Circuit Density of Ratioed Logic in SRAM Devices", U.S. Appl. No. 14/581,067, filed Dec. 23, 2014.

List of IBM Patents or Patent Applications Treated as Related; (Appendix P), Filed Feb. 9, 2016; 2 pages.

* cited by examiner

FIG. 8 ns pecification. The forgoing features are apparent from the following detailed description taken in conjunction with the accompanying drawings in which:

LOW-DRIVE CURRENT FINFET STRUCTURE FOR IMPROVING CIRCUIT DENSITY OF RATIOED LOGIC IN SRAM DEVICES

DOMESTIC PRIORITY

This application is a divisional of U.S. patent application Ser. No. 14/581,067, filed Dec. 23, 2014, the disclosure of which is incorporated by reference herein in its entirety.

BACKGROUND

The present invention relates generally to static random-access memory (SRAM) semiconductor devices, and more particularly, to a method of forming a low current fin field effect transistor (FinFET) structure to improve circuit density of an SRAM device.

SRAM cell design typically begins by selecting the smallest p-type field effect transistor (PFET) supported by a particular technology and then scaling the n-type field effect transistor (NFET) pass gate and pull-up, p-type field effect transistors (PU PFETs) accordingly for proper current drive ratio. Balancing the drive current ratio results in optimizing the read/write operation of the SRAM device. With the recent improvements in PFET device performance (e.g., increased hole mobility through the silicon <110> PFET channels), the recent introduction of increasing amounts of uniaxial strain to PFET devices (both through over-layer stress liner films and embedded silicon germanium (SiGe) source/drains), PFET devices typically provide a higher drive current than the drive current provided by NFET devices. This drive current differential degrades writeability signal to noise margins in existing SRAM designs because the NFET pass-gates are now relatively weaker when operating against the PFET and PU PFET during a write event.

SRAM devices typically implement one or more PFETs (i.e., SRAM PFETs) in the SRAM cell itself, and also one or PFETs (i.e., logic PFETs) in the logic portion. Both the SRAM PFETs and logic PFETs share the same structure, making their performance comparable when corrected for threshold voltage. Conventional methods have addressed the drive current differential by forming the pass gate with multiple fins. Other methods for addressing the drive current differential include implementing additional FET devices (e.g., keeper FETs) connected to the NFET array. Each of these methods control the current drive ratio, but at the cost of diminishing the overall circuit density of the SRAM device.

SUMMARY

According to at least one embodiment of the present invention, a method of fabricating an SRAM semiconductor device includes forming first and second FinFETs on an upper surface of a bulk substrate. The first FinFET includes a first source/drain region containing first dopants, and the second FinFET includes a second source/drain region containing second dopants. The method further includes selectively controlling a temperature of the second FinFET with respect to a temperature of the first FinFET during an anneal process to activate the first and second dopants such that the second source/drain region is formed having a different electrical resistance with respect to the first source/drain region.

According to another embodiment of the invention, a SRAM semiconductor device comprises a first FinFET on an upper surface of bulk substrate. The first FinFET includes a first source/drain region containing a first amount of activated dopants. The SRAM semiconductor device further includes a second FinFET on the upper surface of the bulk substrate. The second FinFET includes a second source/drain region containing a second amount of activated dopants less than the first amount of activated dopants such that the second source/drain region has different electrical resistance with respect to the first source/drain region.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings in which:

DETAILED DESCRIPTION

Various non-limiting embodiments of the invention provide an SRAM device having improved circuit density. Conventional SRAM devices including multi-FinFET structures, which implement one or more additional FET devices (i.e., a "keeper PFET") to create a ratioed logic circuit that controls the drive current of the SRAM device. Unlike conventional SRAM devices, at least one non-limiting embodiment provides an SRAM device having an active dopant differential (i.e., a ratioed active dopant level)

between the source/drain regions of a first FinFET device (e.g., a PFET) and the source/drain regions of a second FinFET device (e.g., a pull-up PFET). According to a non-limiting embodiment, for example, a PU FET includes S/D regions having less active dopants compared to S/D regions of a PFET. In this manner, the PU FET has a lower drive current than the PFET. Accordingly, the drive current ratio between the PU FET and the PFET can be controlled without requiring an additional "keeper PFET", thereby improving the overall circuit density of the SRAM device.

According to another non-limiting embodiment, a process flow describes a method of controlling a level of active dopants in first S/D regions of a first FinFET (e.g., a PU PFET) with respect to a level of active dopants in second S/D regions of a second FinFET (e.g., PFET). In this manner, a drive current ratio between the PU PFET and the PFET can be controlled without requiring additional FinFETs (e.g., a "keeper PFET") to generate the ratioed logic. Accordingly, at least one embodiment provides an SRAM device having an improved circuit density.

Figure 1:
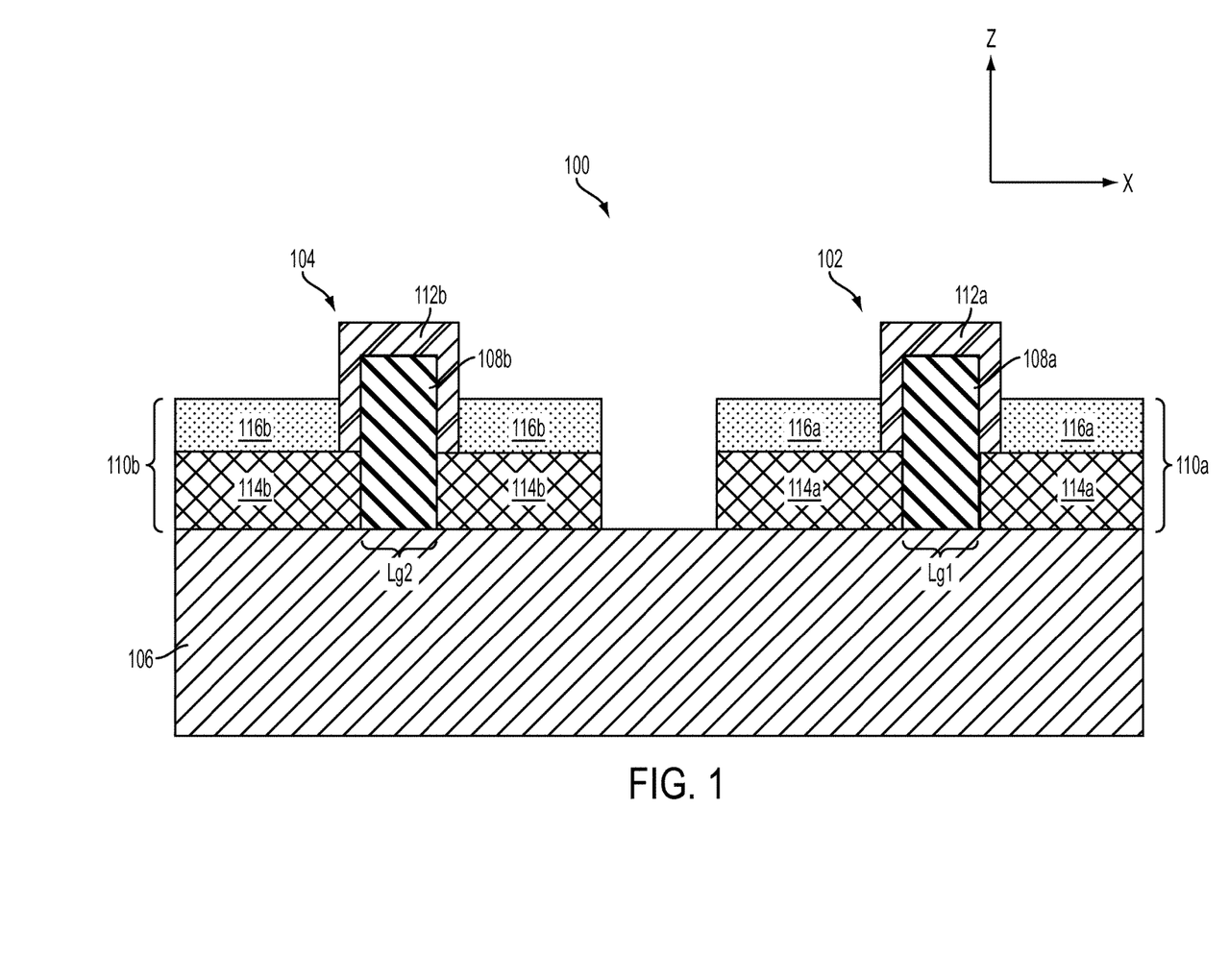
FIG. 1 is a cross-sectional view of an intermediate logic and SRAM device following a dual-gate formation process that forms both a p-type FinFET (PFET) and a pull-up p-type FinFET (PU PFET) respectively on a bulk substrate.

With reference now to FIG. 1, an intermediate SRAM device 100 following a dual-gate formation process is illustrated according to a non-limiting embodiment. In the present specification and claims, an "intermediate" SRAM device is defined as an SRAM device in a stage of fabrication prior to a final stage. The SRAM device 100 includes a first FinFET 102 and a second FinFET 104 formed on an upper surface of a bulk substrate 106. The bulk substrate 106 comprises, for example silicon, and extends along a first axis (e.g., X-axis) to define a length of the SRAM device 100 and along a second axis (e.g., Z-axis) to define a height of the SRAM device 100. The first finFET 102 is a p-type FinFET (PFET) 102, for example, and the second FinFET is a pull-up p-type FinFET (PU PFET) 104, for example. Although the PFET 102 and PU PFET 104 are shown in close proximity to each other, it should be appreciated that the PFET 102 and PU PFET 104 may not be close to each other. For example, the PFET 102 and the PU FET 105 may be formed at separate areas of a semiconductor wafer.

The PFET 102 includes a first gate 108a interposed between first fin portions 110a, and the PU FET 104 includes a second gate 108b interposed between second fin portions 110b. The first and second fin portions 110a-110b define first and second source/drain regions of the PFET 102 and PU FET 104, respectively. The first gate 108a has a gate length (Lg1) that extends along the X-axis, and a gate width that extends perpendicular to the gate length and along a third axis, e.g., a Y-axis (not shown). The first gate 108a comprises polysilicon (PC), for example. A first gate spacer 112a is formed on an upper surface and sidewalls of the first gate 108a. The first gate spacer 112a comprises various materials including, but not limited to, silicon nitride (SiN).

Similarly, the second gate 108b has a gate length (Lg2) that extends along the X-axis, and a gate width that extends perpendicular to the gate length and along a third axis, e.g., a Y-axis (not shown). The second gate 108b comprises polysilicon (PC), for example. A second gate spacer 112b is formed on an upper surface and sidewalls of the second gate 108b. The second gate spacer 112b comprises various materials including, but not limited to, silicon nitride (SiN).

The first fin portion 110a includes a first active semiconductor layer 114a and a first raised S/D layer 116a. The first active semiconductor layer 114a is formed on an upper surface of the bulk substrate 106 and comprises silicon (Si) for example. The first raised S/D layer 116a is formed on an upper surface of the first active semiconductor layer 114a and comprises, for example, silicon germanium (SiGe) doped with boron (B). According to an embodiment, the first raised S/D layer 116a is epitaxially grown from the first active semiconductor layer 114a as understood by one of ordinary skill in the art. Referring further to FIG. 1, a portion of the first gate spacer 112a is interposed between the first gate 108a and the first raised S/D layer 116a.

The second fin portion 110b includes a similar structure as the first fin portion 110a. For instance, the second fin portion 110b includes a second active semiconductor layer 114b and a second raised S/D layer 116b. The second active semiconductor layer 114b is formed on an upper surface of the bulk substrate 106 and comprises silicon (Si), for example. The second raised S/D layer 116b is formed on an upper surface of the second active semiconductor layer 114b and comprises, for example, silicon germanium (SiGe) doped with boron (B). According to an embodiment, the second raised S/D layer 116b is epitaxially grown from the first active semiconductor layer 114b as understood by one of ordinary skill in the art. A portion of the second gate spacer 112b is interposed between the second gate 108b and the second raised S/D layer 116b. It should be appreciated that additional fabrication techniques may be utilized when forming the first and second raised S/D layers 116a-116b including, but not limited to, source/drain straining techniques, injection doping, and in-situ doping.

Figure 2:
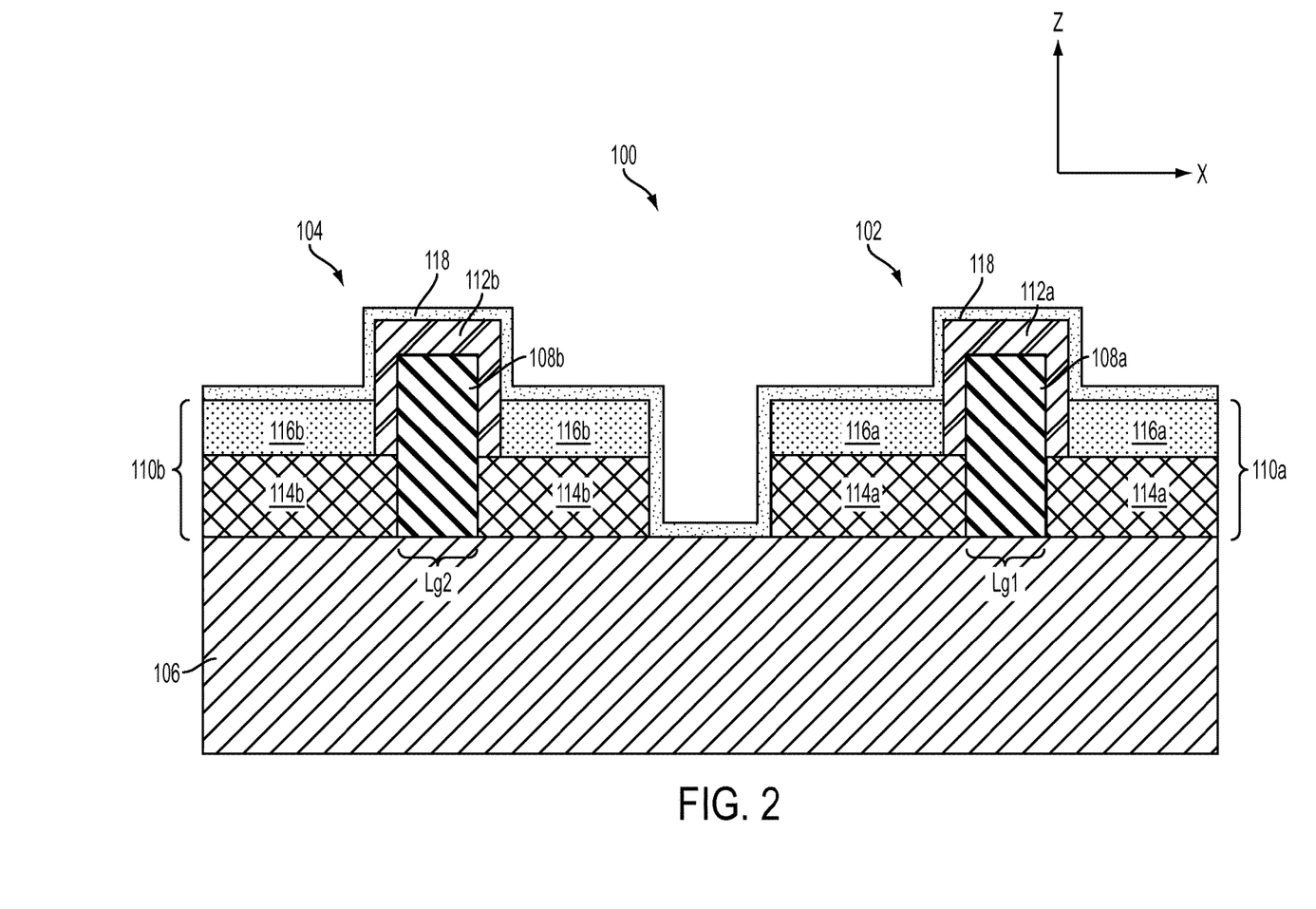
FIG. 2 illustrates the SRAM device of FIG. 1 following deposition of a conformal reflection layer on upper surfaces of the source/drain (S/D) regions and gate spacers of the PFET and PU PFET.

Referring to FIG. 2, a conformal reflection layer 118 is formed on the upper surfaces of the first and second raised source/drain (S/D) layers 116a-116b and the first and second gate spacers 112a-112b of the PFET 102 and PU PFET 104. The conformal reflection layer 118 comprises various materials configured to reflect energy fluence (e.g., laser fluence) including, but not limited to, tantalum nitride (TaN), titanium carbide (TiC), and tungsten (W), and has a thickness ranging from approximately 10 nanometers (nm) to approximately 20 nm. Various methods can be used to deposit the conformal reflection layer 118 including, but not limited to, an atomic layer deposition (ALD) process.

Figure 3:
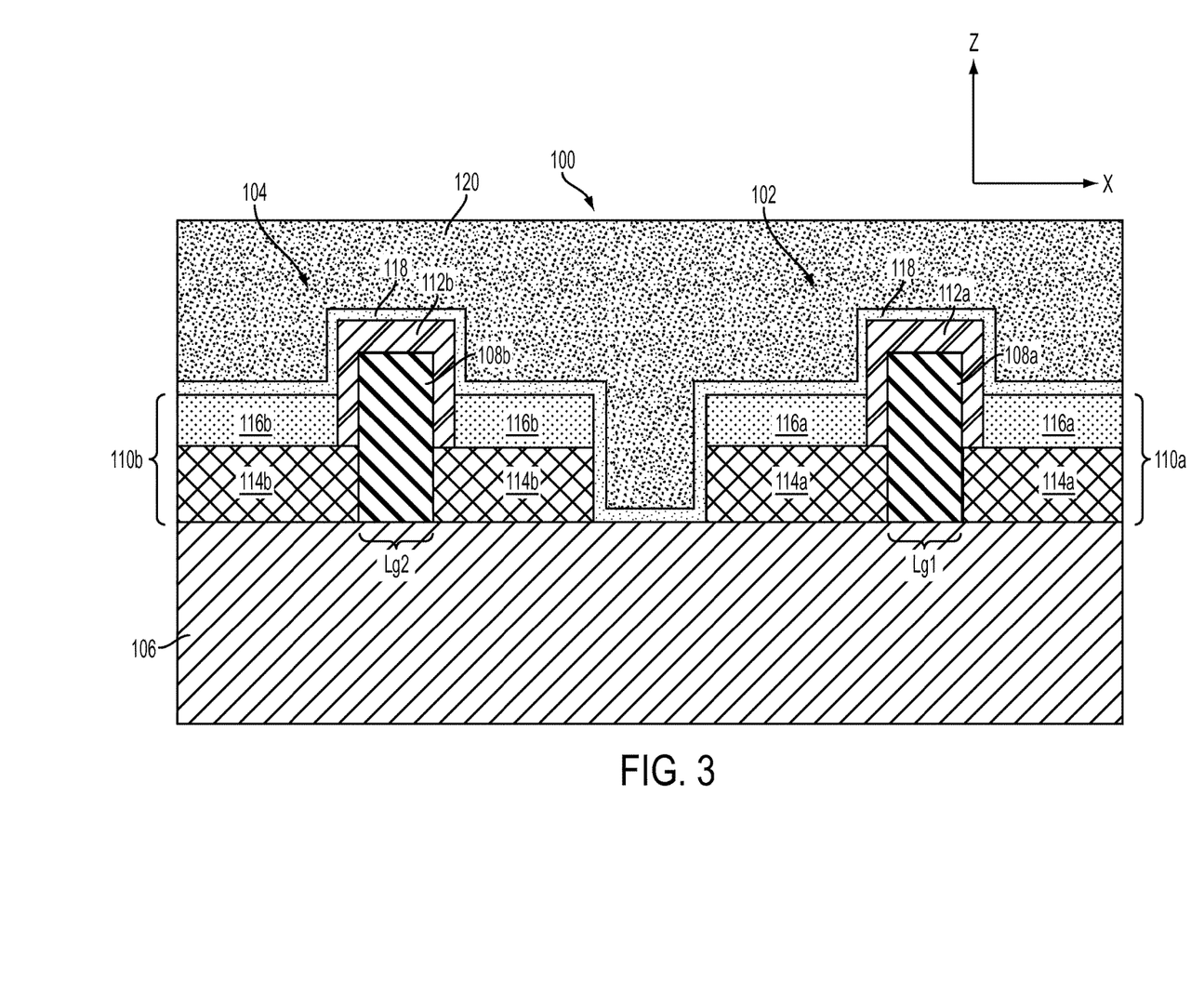
FIG. 3 illustrates the SRAM device of FIG. 2 after depositing a block mask layer on an upper surface of the conformal reflection layer formed on both the PFET and the PU FET.

Referring now FIG. 3, the SRAM device 100 is illustrated following deposition of a block mask layer 120 on an upper surface of the conformal reflection layer 118 of both the PFET 102 and the PU FET 104. The block mask layer 120 comprises amorphous carbon, for example, and can be deposited using, for example, a plasma enhanced chemical vapor deposition (PECVD) process as understood by one of ordinary skill in the art.

Figure 4:
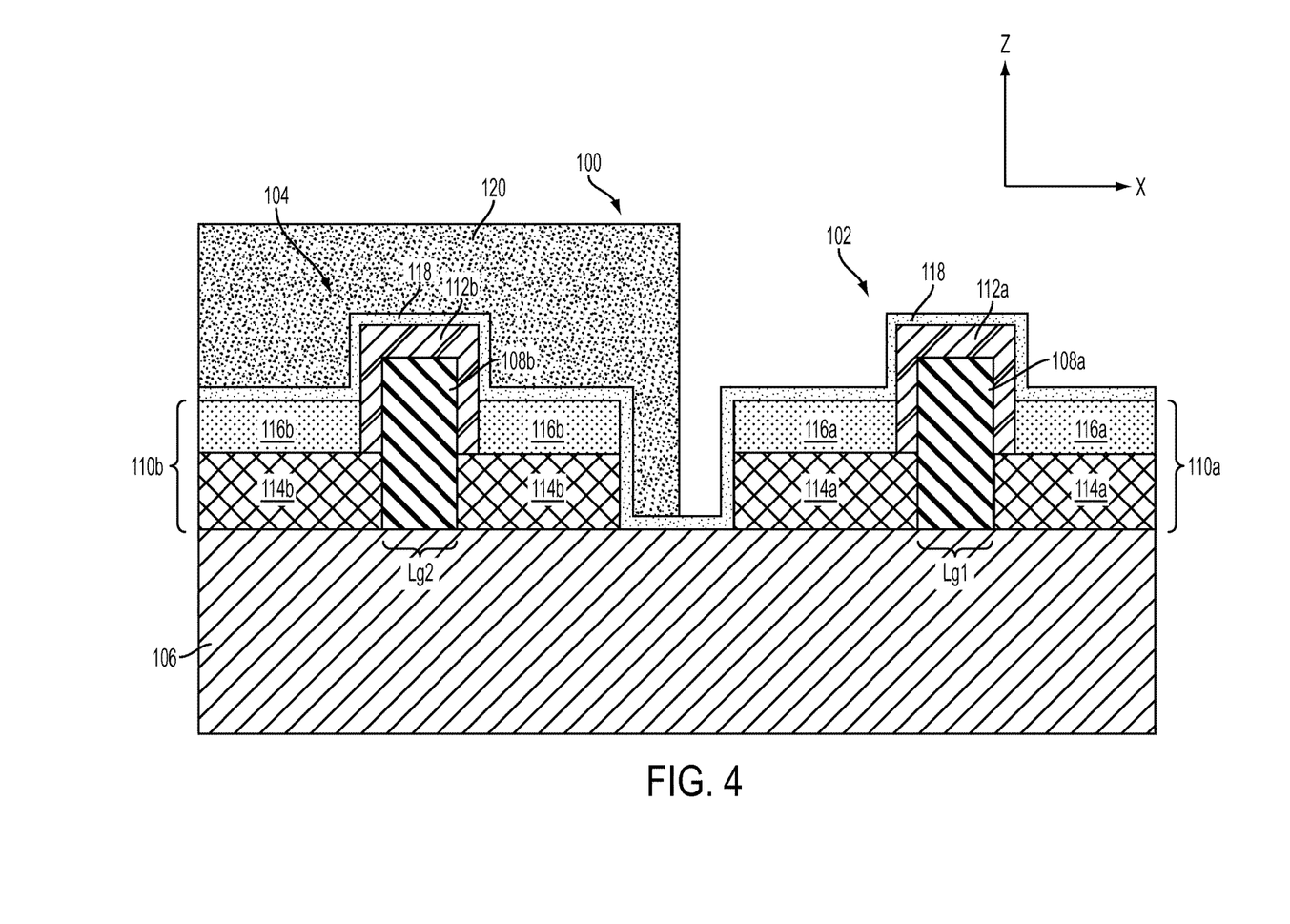
FIG. 4 illustrates the SRAM device of FIG. 3 after patterning a portion of the block mask layer to expose the PFET.

Turning to FIG. 4, the SRAM device 100 is illustrated following a patterning process that patterns a portion of the block mask layer 120 and exposes the PFET 102. The patterning process may include additional mask layers (not shown) to cover the PU PFET 104 while patterning the PFET 102 using a selective oxygen-based reactive ion etching (RIE) process, for example, as understood by one of ordinary skill in the art. In this manner, a portion of the conformal reflection layer 118 formed on the PFET is exposed while the remaining portion of the conformal reflection layer 118 formed on the PU PFET 104 remains covered as further illustrated in FIG. 4.

Figure 5:
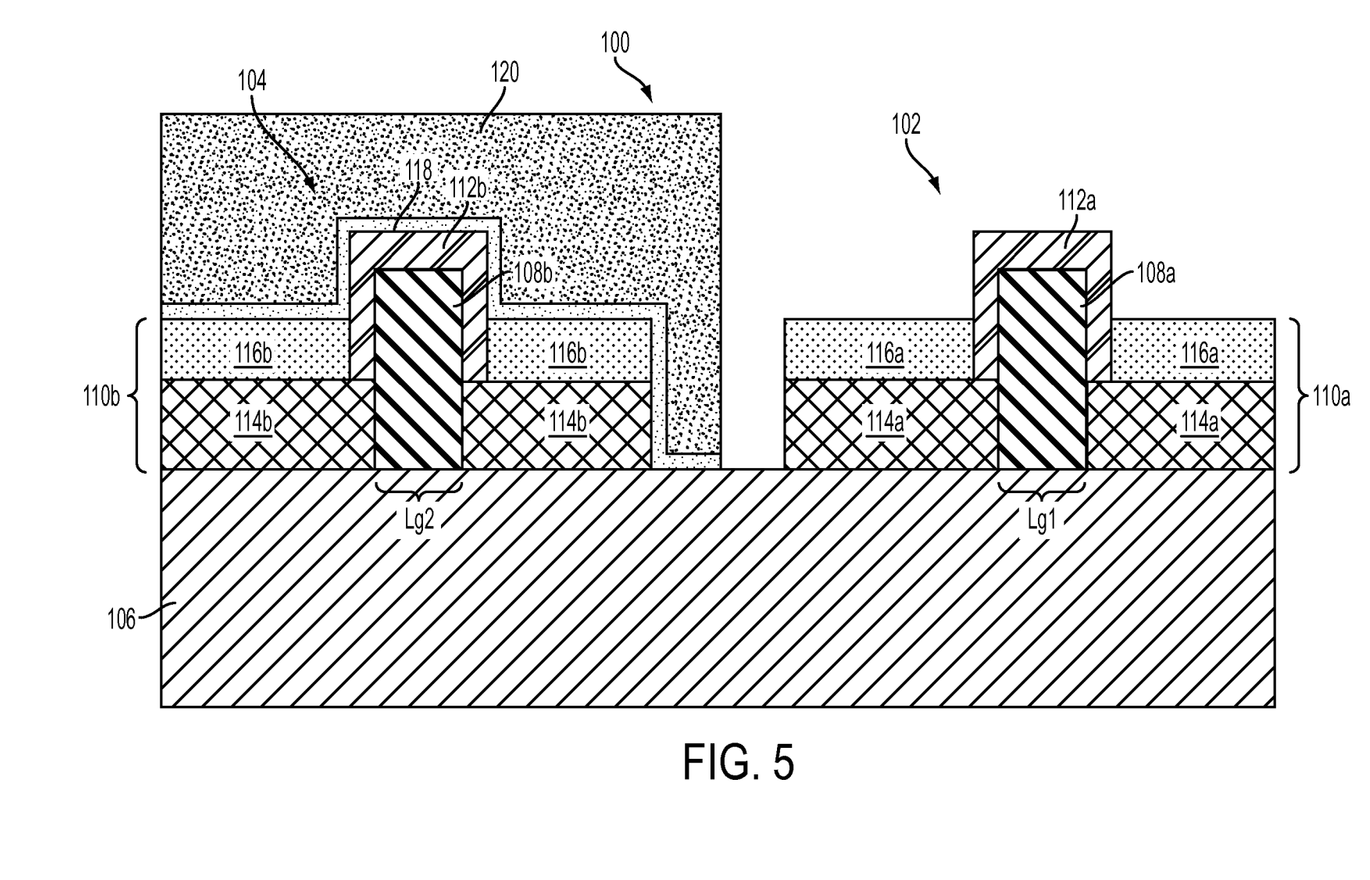
FIG. 5 illustrates the SRAM device of FIG. 4 after removing a portion of the conformal reflective layer to expose first S/D regions of the PFET.

Referring to FIG. 5, the SRAM device 100 is illustrated after removing the exposed conformal reflection layer 118 from the upper surface of the PFET 102. Accordingly, the first active semiconductor layer 114a and the first raised S/D layer 116a are exposed, while the PU PFET 104 remains covered by the remaining block mask layer 120. The exposed conformal reflection layer 118 can be selectively removed according to, for example, a selective plasma etching process as understood by one of ordinary skill in the art.

Figure 6:
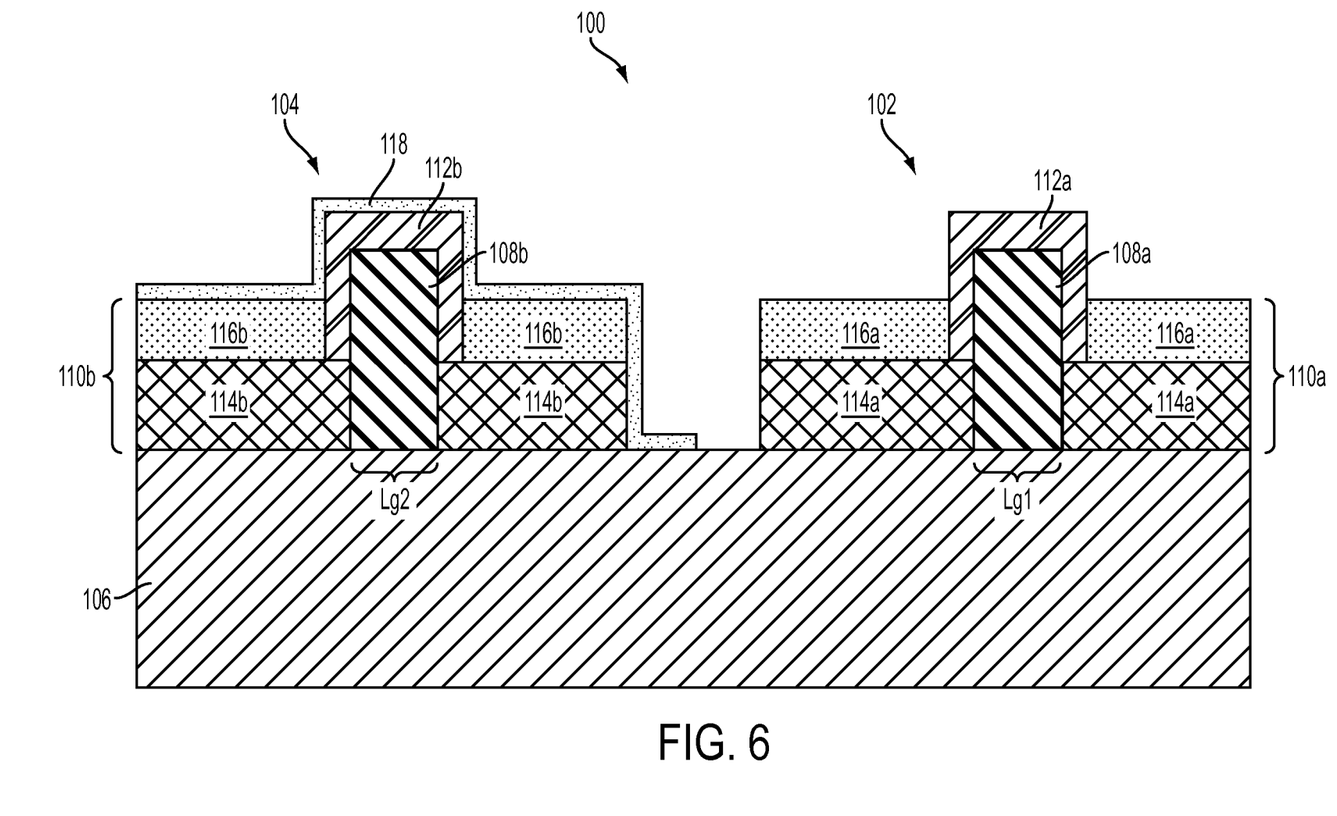
FIG. 6 illustrates the SRAM device of FIG. 5 after removing the remaining portion of the block mask layer to expose the conformal reflective layer formed on second S/D regions of the PU PFET.

Turning to FIG. 6, the SRAM device 100 is illustrated following removal of the remaining block mask layer 120 covering the PU PFET 104. As described above, the block mask layer 120 can be selectively removed using, for example, a selective oxygen-based RIE process. In this manner, the remaining conformal reflection layer 118 is exposed.

Figure 7:
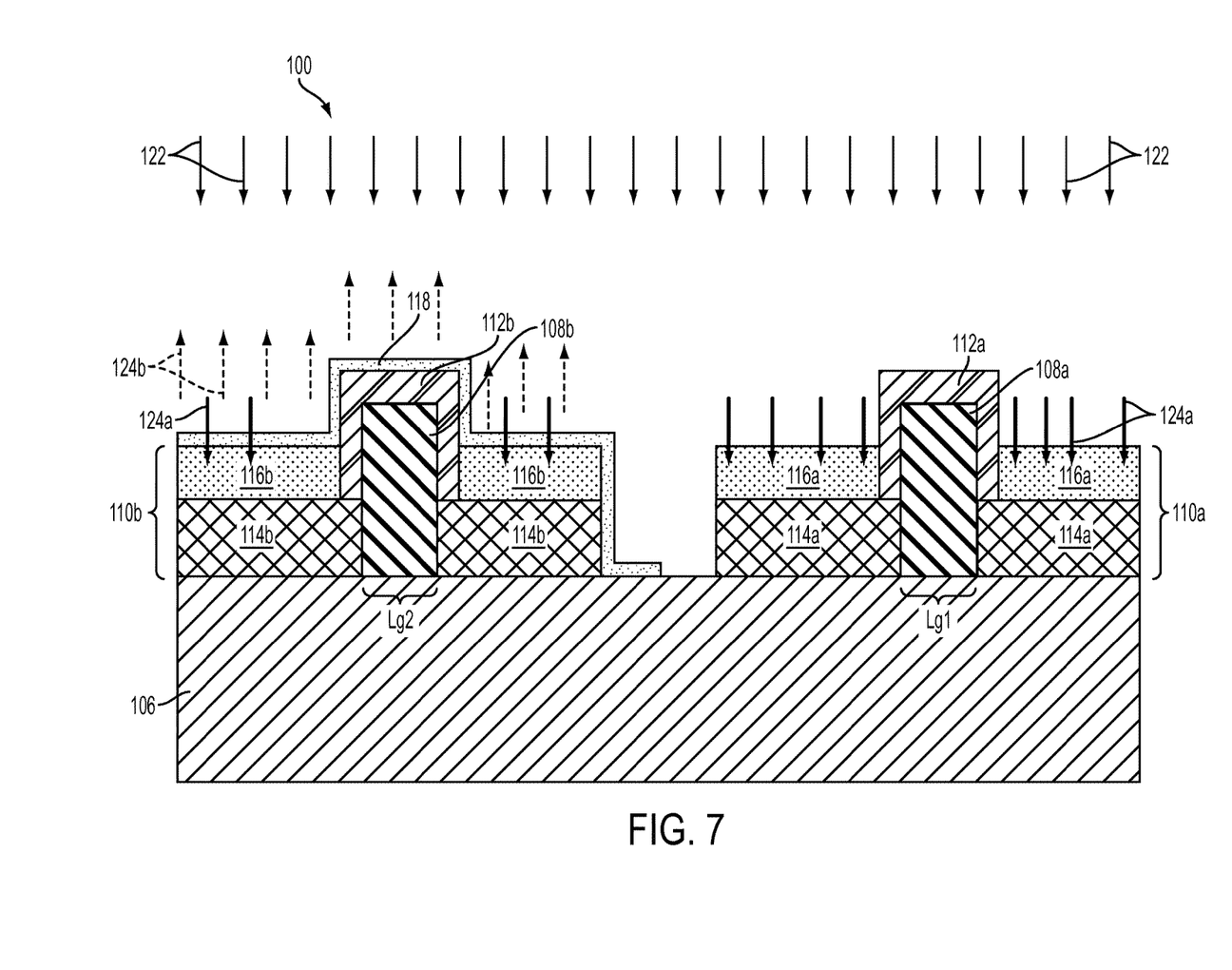
FIG. 7 illustrates the SRAM device of FIG. 6 while undergoing a laser anneal process where the laser fluence penetrates into the first S/D regions of the PFET while the conformal reflection layer reflects a portion of the laser fluence from reaching the second S/D regions of the PU PFET.

Referring now to FIG. 7, the SRAM device 100 is illustrated undergoing an anneal process that directs energy fluence toward the PFET 102 and the PU FET 104. According to an embodiment, the anneal process is a laser anneal process that utilizes a laser unit (not shown) which generates laser fluence (arrows) 122 that is directed toward the upper surfaces of the PFET 102 and the PU FET 104. With respect to the PFET 102, the laser fluence penetrates into the first raised S/D layer 116a, thereby causing the temperature of the first raised S/D layer 116a to increase. The increased temperature induces activation of the doped boron ions included in the first raised S/D layer 116a. The level of activated doped boron ions controls the resistance of the first raised S/D layer 116a. For instance, the resistivity of an S/D layer decreases as the level of activated boron dopants increases. As a result, a fully activated S/D layer allows for relatively high current flow through the fin portion of the PFET. In terms of the PFET 102 shown in FIG. 7, non-reflected laser fluence (arrows 124a) penetrates into the first raised S/D layer 116a without obstruction. Therefore, a complete activation, or nearly complete activation, of the doped boron included in the first raised S/D layer 116a is achieved, thereby allowing for high current flow therethrough.

With respect to the PU PFET 104, however, the remaining conformal reflective layer 118 is configured to reflect the laser fluence as further illustrated in FIG. 7. The thickness of the conformal reflective layer 118 can dictate the amount of laser fluence that is reflected, or in other words, the amount of laser fluence that reaches the underlying second S/D layer 116b. According to the non-limiting embodiment illustrated in FIG. 7, the conformal reflective layer 118 has a thickness that partially reflects the laser fluence (arrows 124b), thereby allowing only a partial amount of non-reflected laser fluence (arrows 124a) to penetrate into the second raised S/D layer 116b. The second raised S/D layer 116b is heated to a temperature that is less than the temperature of the first raised S/D layer 116b, thereby causing a lower level of activated boron ions in the second raised S/D layer 116 compared to level of activated boron ions included in the first raised S/D layer 116a. Although FIG. 7 illustrates a partial reflection of the laser fluence, it should be appreciated that the conformal reflective layer 118 can have a thickness that completely reflects the entire laser fluence directed to the PU PFET 104.

Figure 8:
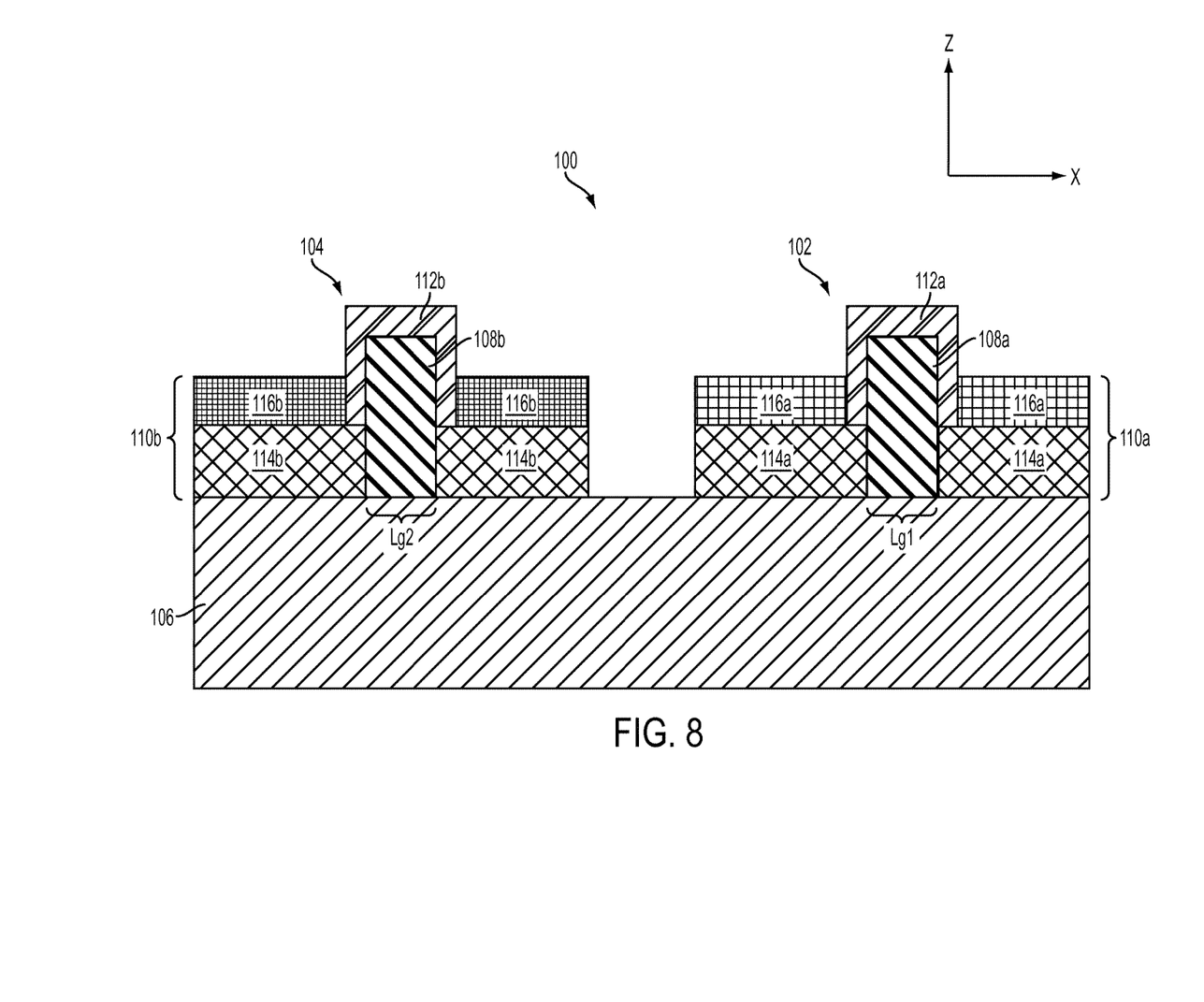
FIG. 8 illustrates the SRAM device of FIG. 7 after removing the conformal reflective layer to provide a final SRAM device including a PU PFET having less activated dopants in the second S/D regions compared to the first S/D regions of the PFET.

Turning now to FIG. 8, the SRAM device 100 is illustrated following removal of the conformal reflective layer 118 formed on the PU PFET 104. Accordingly, a final SRAM device 100 is illustrated including a PU PFET 104 having less activated dopants in the second raised S/D layer 116b compared to the level of activated dopants included in the first raised S/D layer 116a of the PFET 102. More specifically, the second raised S/D layer 116b of the PU PFET 104 has a lower level of activated dopants than the level of activated dopants included in the first raised S/D layer 116a of the PFET 102. In this manner, the second raised S/D layer 116b has a higher resistivity than the first raised S/D layer 116. Therefore, the second raised S/D layer 116b of the PU FET 104 provides a lower drive current than the drive current provided by the first raised S/D layer 116b of the PFET 102. Thus, the drive current ratio of the SRAM device 100 can be controlled without requiring additional FinFETs (e.g., "keeper FETs"). As a result, the overall circuit density of the final SRAM device 100 is improved.

As described above, various non-limiting embodiments of the invention provide an SRAM device having an active dopant differential (ratioed active dopant level) between the S/D regions of a first FinFET device (e.g., a PFET) and the S/D regions of a second FinFET device (e.g., a pull-up PFET). For example, a PU PFET includes first S/D regions having less active dopants compared to second S/D regions of a PFET such that the PU PFET has a lower drive current than the PFET. In this manner, the drive current ratio of the SRAM device can be controlled without requiring an additional "keeper PFET", thereby improving the overall circuit density of the SRAM device.

Various well-known methods exist for determining the amount of activated dopants in a semiconductor material. For example, various photoscanning techniques based on laser-light induced currents or voltages can be used to detect active dopant levels in semiconductor materials as understood by one of ordinary skill in the art. Accordingly, it should be appreciated that conventional active doping techniques can be used to determine that an SRAM device fabricated according to at least one non-limiting embodiment of the includes a first FinFET structure having a first amount of active dopants and a second FinFET structure having a second amount of active dopants less than the first amount of active dopants.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The flow diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. A SRAM semiconductor device, comprising:
a first FinFET on an upper surface of bulk substrate, the first FinFET including a p-type FinFET (PFET) having a first source/drain region;
a first raised source/drain (S/D) layer on the first source/drain region, the first raised source/drain layer containing a first amount of activated dopants;
a second FinFET on the upper surface of the bulk substrate, the second FinFET including a pull-up p-type FinFET (PU FET) having a second source/drain region; and
a second raised S/D layer on the second source/drain region, the second raised source/drain layer containing a second amount of activated dopants that is less than the first amount of activated dopants such that the second source/drain region has a different electrical resistance with respect to the first source/drain region,
wherein the first source/drain layer has first electrical resistance and the second source/drain layer has a second electrical resistance that is greater than the first electrical resistance, and
wherein the first electrical resistance defines a first current drive throughput of the p-type FinFET (PFET) and the second electrical resistance defines a second drive current throughput of the pull-up p-type FinFET (PU FET) that is less than the first drive current throughput to control a drive current ratio between the p-type FinFET (PFET) and the pull-up p-type FinFET (PU FET).

2. The SRAM semiconductor device of claim 1, wherein the first electrical resistance defines a first current drive throughput of the first source/drain region and the second electrical resistance defines a second drive current throughput of the second source/drain region that is less than the first drive current throughput.

3. The SRAM semiconductor device of claim 2, wherein the first and second drive current throughputs define the drive current ratio of the SRAM semiconductor device.

4. The SRAM semiconductor device of claim 3, wherein the first raised S/D layer comprises silicon germanium (SiGe) containing the first activated dopants, and the second raised S/D layer comprises silicon germanium (SiGe) containing the second activated dopants.

5. The SRAM semiconductor device of claim 4, wherein the first and second activated dopants are boron.

6. The SRAM semiconductor device of claim 1, wherein the first activated dopants are of the same type as the second activated dopants.

7. The SRAM semiconductor device of claim 1, wherein the first and second raised source/drain (S/D) layers are at opposing sides of a gate, and the first and second amount of activated dopants do not extend beneath the gate.

8. A SRAM semiconductor device, comprising:
a first FinFET on an upper surface of bulk substrate, the first FinFET including a type FinFET (PFET) having a first source/drain region;
a first raised source/drain (S/D) layer on the first source/drain region, the first raised S/D layer having a first electrical resistance; and
a second FinFET on the upper surface of the bulk substrate, the second FinFET including a pull-up p-type FinFET (PU FET) having a second source/drain region;
a second raised S/D layer on the second source/drain region, the second raised S/D layer having a second electrical resistance that is different from the first electrical resistance,
wherein the first and second electrical resistances define a drive current ratio between the first and second FinFETs,
wherein the first electrical resistance defines a first current drive throughput of the p-type FinFET (PFET) and the second electrical resistance defines a second drive current throughput of the pull-up p-type FinFET (PU FET) that is less than the first drive current throughput to control a drive current ratio between the p-type FinFET (PFET) and the pull-up p-type FinFET (PU FET).

9. The SRAM semiconductor device of claim 8, wherein the first raised S/D layer contains a first amount of dopants defining the first resistance and the second raised S/D layer contains a different second amount of dopants defining the second electrical resistance.

10. The SRAM semiconductor device of claim 9, wherein the first raised S/D layer comprises silicon germanium (SiGe) containing the first activated dopants, and the second raised S/D layer comprises silicon germanium (SiGe) containing the second activated dopants.

11. The SRAM semiconductor device of claim 10, wherein the first and second activated dopants are boron.

12. The SRAM semiconductor device of claim 9, wherein the first and second raised source/drain (S/D) layers are at opposing sides of a gate, and the first and second amount of activated dopants do not extend beneath the gate.

13. The SRAM semiconductor device of claim 8, wherein the first activated dopants are of the same type as the second activated dopants.

* * * * *